United States Patent
Veselic

(10) Patent No.: US 9,285,412 B2
(45) Date of Patent: Mar. 15, 2016

(54) HIGH SPEED, HIGH CURRENT, CLOSED LOOP LOAD TRANSIENT TESTER

(71) Applicant: Dialog Semiconductor GmbH, Kirchheim/Teck-Nabern (DE)

(72) Inventor: Mladen Veselic, Kirchheim-Teck-Nabern (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 583 days.

(21) Appl. No.: 13/623,284

(22) Filed: Sep. 20, 2012

(65) Prior Publication Data

US 2014/0077830 A1    Mar. 20, 2014

(51) Int. Cl.
*G01R 31/00* (2006.01)
*G01R 31/02* (2006.01)
*G01R 31/40* (2014.01)

(52) U.S. Cl.
CPC ............... *G01R 31/02* (2013.01); *G01R 31/40* (2013.01)

(58) Field of Classification Search
CPC ... G01R 31/40; G01R 31/31721; G01R 31/00
USPC ............... 324/750.01, 762.09, 764.01
See application file for complete search history.

(56) References Cited

U.S. PATENT DOCUMENTS

| | | | | |
|---|---|---|---|---|
| 2,623,925 A * | 12/1952 | Schaefer | ...................... | 324/416 |
| 3,898,561 A * | 8/1975 | Leighton, Sr. | ............ | 324/765.01 |
| 3,947,757 A * | 3/1976 | Grube et al. | .................. | 324/416 |
| 4,112,748 A * | 9/1978 | Walley | ........................ | 73/114.59 |
| 4,222,005 A * | 9/1980 | Naito | ........................ | 324/762.01 |
| 4,369,407 A * | 1/1983 | Korbell | ......................... | 324/416 |
| 5,537,030 A * | 7/1996 | Snodgrass et al. | ........ | 324/756.05 |
| 6,507,210 B1 * | 1/2003 | Olson | ...................... | 324/764.01 |
| 2004/0227538 A1 * | 11/2004 | Harris | ............................ | 324/763 |
| 2007/0126449 A1 * | 6/2007 | Ou Yang et al. | .............. | 324/763 |

OTHER PUBLICATIONS

Load Transient Response Testing for Voltage Regulators, http://cds.linear.com/docs/en/application-note/an104f.pdf, Oct. 2006.*

* cited by examiner

*Primary Examiner* — Jermele M Hollington
*Assistant Examiner* — Demetrius Pretlow
(74) *Attorney, Agent, or Firm* — Saile Ackerman LLC; Stephen B. Ackerman

(57) ABSTRACT

The present document relates to voltage regulators (101). In particular, the present document relates to the testing of voltage regulators subject to load transients. A test device (110) configured to generate a load current to be drawn at an output of a voltage regulator (101) is described. The test device (110) comprises a load connector (116) for coupling the test device (110) to the output of the voltage regulator (101); a transistor (113) configured to modulate the current through the load connector (116) subject to a control signal (123); wherein the current through the load connector (116) corresponds to the load current; a current sense resistor (112) arranged in series with the transistor (113) and configured to provide a feedback voltage (121) which is substantially proportional to the load current; and an operational amplifier (111) configured to generate the control signal (123) based on the feedback voltage (121) and based on a target voltage (122).

17 Claims, 2 Drawing Sheets

HIGH SPEED, HIGH CURRENT, CLOSED LOOP LOAD TRANSIENT TESTER

TECHNICAL FIELD

The present document relates to voltage regulators. In particular, the present document relates to the testing of voltage regulators subject to load transients.

BACKGROUND

The performance of voltage regulators of various types (e.g. switched-mode voltage converters such as buck converters or linear voltage regulators such as Low Drop Out, LDO, voltage regulators) subject to load transients is typically tested during the design phase of the voltage regulators. Such load transient tests may be performed using an open loop test device which comprises a switching element in series with a current limiting resistor. The test device is coupled to the output of the voltage regulator. The switching element of the test device may be used to turn on/off the load, thereby submitting the voltage regulator to the load transient (no load, i.e. no load current, if the switch is turned off and a pre-determined load, i.e. a pre-determined load current through the resistor, if the switch is turned on). Usually an excitation circuit drives the switching element (e.g. a transistor) to saturation when turning on the switch, such that the current limiting resistor appears as a load to the voltage regulator.

The use of the above mentioned open loop test device for testing the performance of a voltage regulator subject to load transients has various disadvantages. In particular, the open loop test device does not provide any possibility to control the rise and/or fall edges of the load transient. Furthermore, the open loop test device does not provide any possibility to control the initial load current of the load transient. In addition, the open loop test device does not provide any possibility to control the amplitude of the load current because a fixed limiting resistor is used.

This requires a change of the current limiting resistor when a different output voltage of the voltage regulator is to be tested.

The present document addresses the above mentioned shortcomings of load transient test devices. In particular, the present document describes a test device which allows for a relatively high current sink (i.e. for a relatively high load current) even while operating the voltage regulator under test with low output voltages. In addition, the test device allows to control the rise and/or fall edges of the load transient, to control the amplitude of the load current, and/or to control a steady state current offset. Furthermore, the test device allows for fast slew rates, e.g. of more than 50 A/µs at 1V of regulator output voltage.

SUMMARY

According to an aspect, a test device configured to generate a load current to be drawn at an output of a voltage regulator is described. The test device may be used to test the performance of the voltage regulator subject to transients of the load current. In particular, the test device may be configured to generate a load current having a profile which corresponds to a pre-determined target load profile (e.g. a pre-determined target voltage). The test device comprises a load connector for coupling the test device to the output of the voltage regulator. The load connector may e.g. be implemented as a PCB board edge connector which is pluggable into a corresponding female connector of the voltage regulator. The test device may be configured to draw the load current through the load connector.

The test device may further comprise a transistor configured to modulate the current through the load connector subject to a control signal. The current through the load connector typically corresponds to the load current. The current through the load connector typically corresponds to a drain-source current through the transistor. The transistor may be a metal oxide semiconductor field effect transistor (MOSFET), e.g. an n-type MOSFET. The control signal may comprise a gate voltage which is applied to a gate of the transistor. The gate voltage may be used to control a drain-source resistance of the transistor, thereby controlling the drain-source current through the transistor. In another embodiment, the transistor is a Bipolar Junction Transistor (BJT).

Furthermore, the test device typically comprises a current sense resistor arranged in series with the transistor and configured to provide a feedback voltage which is substantially proportional to the load current. The current through the current sense resistor may correspond to the drain-source current through the transistor and to the load current drawn by the test device at the output of the voltage regulator. The current sense resistor may be exchangeable, thereby allowing to adapt the test device to different ranges of load currents. A parasitic inductance of the current sense resistor is preferably at or below an inductance threshold of e.g. 10 nH or less, thereby ensuring that the current sense resistor does not induce oscillations of the load current at high slew rates.

The test device may further comprise an operational amplifier configured to generate the control signal based on the feedback voltage and based on a target voltage. The operational amplifier may be configured to generate the control signal such that an absolute difference between the feedback voltage and the target voltage is reduced (e.g. minimized).

Typically, the transistor exhibits a gate capacitance. In a preferred embodiment, the gate charge of the transistor is at or below 4 nC, in order to ensure the implementation of fast load transients. The operational amplifier may be configured to provide a current corresponding to the gate capacitance within a time interval which is at or below a charging time threshold, wherein the charging time threshold may be associated with the desired speed of the load transients. The charging time threshold may be at or below 100 ns.

In a similar manner, the transistor may exhibit a rise and/or fall time which is at or below a rise and/or fall time threshold, respectively. The rise and/or fall time threshold may be at or below 10 ns. In particular, the sum of the charging time threshold and the rise and/or fall time threshold may be at or below 100 ns.

The test device may further comprise a target load connector configured to couple the test device to an external function generator providing the target voltage. Furthermore, the test device may comprise a voltage divider arranged between the target load connector and an input of the operational amplifier. The voltage divider may be configured to scale the target voltage provided at the target load connector. The voltage divider may be designed depending on the current sense resistor, e.g. in order to align the scaling of the target voltage to the scaling of the load current. Furthermore, the test device may comprise an input termination resistor arranged between the target load connector and the input of the operational amplifier. The input termination resistor may be configured to adapt an impedance of the test device at the target load connector.

The components of the test device, notably the load connector, the current sense resistor, the transistor and the operational amplifier may be arranged on a printed circuit board (PCB). The load connector, the transistor and the current sense resistor may be arranged such that a conductive path from the load connector, via the transistor and the current sense resistor to ground is at or below a pre-determined path length threshold. The pre-determined path length threshold may be selected such that the inductance of the conductive path does not lead to ringing and/or instability of the test device. A short conductive path (having a low inductance) may e.g. be implemented by arranging the current sense resistor and the transistor on opposite sides of the printed circuit board, thereby allowing for a short conductive path between the source of the transistor and the current sense resistor. Alternatively or in addition, a short conductive path (having a low inductance) may e.g. be implemented by arranging the transistor in direct vicinity of the load connector, and by coupling a drain of the transistor directly (e.g. without intermediate components) to the load connector.

The test device may comprise a heat sink for cooling purposes.

According to a further aspect, a system comprising a voltage regulator and a test device according to any of the aspects of the present document is described.

According to another aspect, a method for testing a voltage regulator subject to a load current is described. The method comprises generating a target voltage corresponding to a target load current. Furthermore, the method comprises generating a control signal for a transistor, based at least on the target voltage. The control signal may control a drain-source resistance of the transistor. Furthermore, the method may comprise sensing a drain-source current through the transistor, thereby yielding a corresponding feedback voltage. The drain-source current typically corresponds to the load current drawn at an output of the voltage regulator. The control signal may also be generated based on the feedback voltage. In particular, the control signal may be generated such that a deviation of the feedback voltage from the target voltage is reduced.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

SHORT DESCRIPTION OF THE FIGURES

The invention is explained below in an exemplary manner with reference to the accompanying drawings, wherein FIG. 1 illustrates a block diagram of an example transient test device;

DETAILED DESCRIPTION

Figure 1:
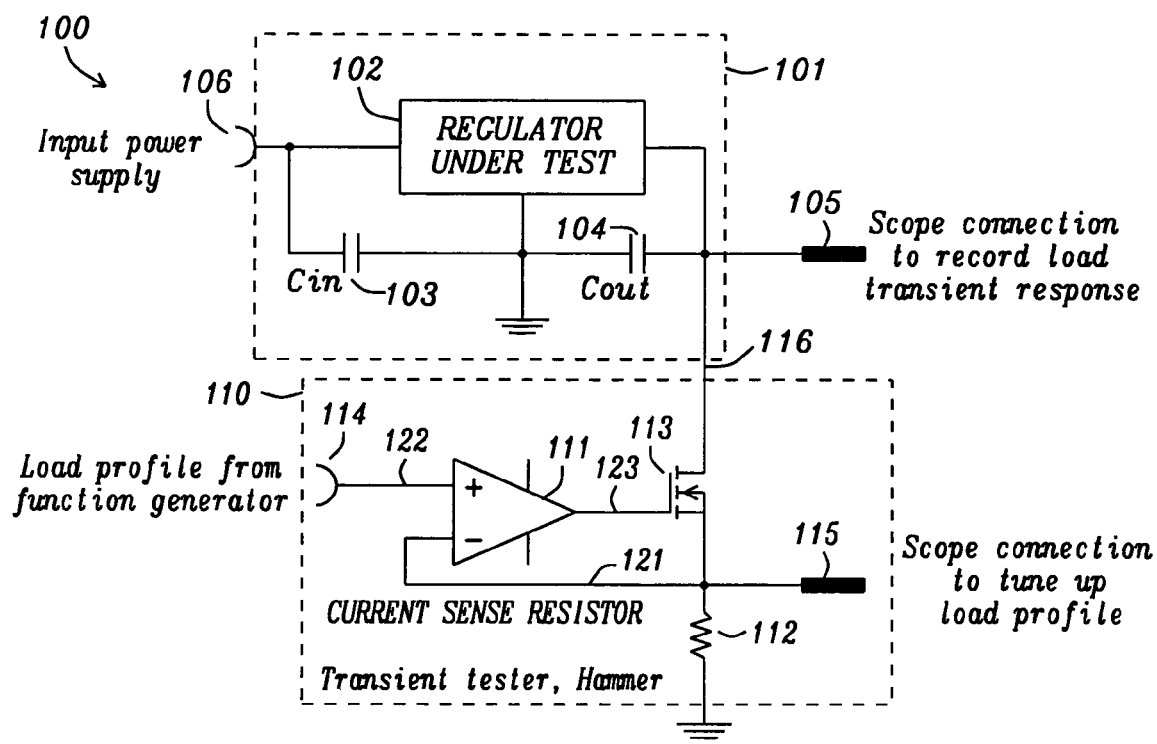

FIG. 1 illustrates a block diagram of an example system 100 comprising a voltage regulator 101 and a transient test device 110 configured to test the voltage regulator 101 subject to a load transient. The voltage regulator 101 may comprise a switched-mode power converter such as a buck converter, a boost converter or a SEPIC (Single-Ended Primary-Inductor) converter. Alternatively or in addition, the voltage regulator 101 may comprise a linear regulator, such as a low drop-out (LDO) regulator. In the illustrated example, the voltage regulator 101 comprises a core regulator 102, as well as an input capacitor 103 which may be used for decoupling purposes and an output capacitor 104 which may be used to stabilize an output voltage provided by the voltage regulator 101.

The voltage regulator 101 is typically configured to provide the output voltage at the output pin 105 subject to an input power supply applied to the input 106 of the voltage regulator 101. The output voltage at the output pin 105 may be used e.g. as a power supply for a processor of an electronic device (e.g. a smartphone or a mobile phone). For this purpose, the output voltage should be stable, even subject to load transients (which may occur e.g. when the processor of the electronic device changes from a sleep mode to an active mode and/or vice versa). Typical values for the output voltage are in the range of 0.6V to 1.2V (e.g. 1V). When moving from the sleep mode to the active mode, the processor of an electronic device may draw up to 50 A of current which results in a significant load transient. The voltage regulator 101 should be configured to provide a stable output voltage (of e.g. 1V), even when being subjected to such a load transient.

The present document describes a transient test device 110 which may be used to submit the voltage regulator 101 to various forms of load transients. The transient test device 110 may be used e.g. during the design phase of the voltage regulator 101. FIG. 1 shows an example transient test device 110 for the voltage regulator 101. The transient test device 110 of FIG. 1 comprises a transistor 113 which is arranged in series with a current sense resistor 112. The current sense resistor 112 may be used to set a range for the load current which is drawn by the test device 110. Furthermore, the current sense resistor 112 is used for current sensing purposes, as the voltage drop 121 across the current sense resistor 112 provides an indication of the load current. The voltage drop 121 across the current sense resistor 112 may be referred to as a feedback voltage 121 which is substantially proportional to the load current. The feedback voltage 121 may be provided at a pin 115 of the test device 110, thereby providing access to the actual load current drawn by the test device 110.

The test device 110 further comprises an operational amplifier 111 which is configured to control the transistor 113 in accordance to a target load profile 122. The test device 110 may comprise an input pin 114 for receiving the target load profile 122. In particular, the operational amplifier 111 may be configured to generate a gate voltage 123 to be applied to the gate of the transistor 113, wherein the gate voltage 123 controls the current flow through the transistor 113. The operational amplifier 111 may be configured to compare the target load profile 122 (also referred to as a target voltage 122) with the feedback voltage 121. Furthermore, the operational amplifier 111 may be configured to control the transistor 113 such that the feedback voltage 121 corresponds to the target voltage 122. In other words, the operational amplifier 111 may be configured to reduce a deviation of the feedback voltage 121 from the target voltage 122.

As such, the operational amplifier 111 may be configured to receive a target voltage 122 at one of its inputs and to compare this target voltage 122 with the feedback voltage 121. As indicated above, the feedback voltage 121 is indicative (e.g. is proportional) to the load current. By consequence, the operational amplifier 111 may be used to control the transistor 113 such that the load current drawn by the test device 110 is substantially proportional to the target voltage 122. For this purpose, the transistor 113 may be operated in its linear mode, i.e. the drain-source resistance of the transistor 113 may be modified, subject to the control signal 123 (i.e. the gate voltage) generated by the operational amplifier 111. In a preferred embodiment, the transistor 113 is a MOSFET (metal oxide semiconductor field effect transistor), notably an N-type MOSFET, because it has been observed that a MOSFET allows for a stable operation of the test device 110 (i.e. a MOSFET gives more stability). Alternatively, the transistor 113 may be implemented as an N-type bipolar transistor.

The test device 110 may be implemented on a PCB (Printed Circuit Board) of relatively small size. The test device 110 may be provided with a connector 116 to the PCB board which comprises the voltage regulator 101 under test. Furthermore, the test device 110 may comprise a connector for coupling the test device 110 to an external power supply. In addition, the test device 110 typically comprises a connector 114 for receiving the target load profile 122 (i.e. a target voltage 122 which corresponds to the target load current profile). The target load profile 122 is usually supplied by an external function generator.

As indicated above, the test device 110 comprises a current feedback operational amplifier 111, e.g. a high speed current feedback operation amplifier 111. This feedback operational amplifier 111 allows the use of a feedback from the current shunt 112 (i.e. from the voltage drop across the current sense resistor 112). Furthermore, the operational amplifier 111 enables the transient test device 110 to accurately track the target load profile 122, i.e. to ensure that the load current drawn by the test device 110 corresponds to the target load profile 122. As indicated above, the test device 110 comprises the transistor 113 which is preferably a MOSFET, notably a fast, low gate charge MOSFET transistor. In addition, the test device 110 comprises a current sense resistor 112 (also referred to as a current shunt) for providing a current feedback to the operational amplifier 111. In a preferred embodiment, the resistor 112 is a low inductance surface mount current shunt.

As such, the test device 110 comprises a current sense resistor 112 (which is used to set the operational range of the test device and to provide a feedback voltage 121 indicative of the load current drawn by the test device 110), a transistor 113 (which is used to control the waveform of the load current by providing a variable drain-source resistance), and an operational amplifier 111 (which compares the feedback voltage 121 to the target load profile 122 and generates a control signal 123 for the transistor 113, such that the deviation between the feedback voltage 121 and the target load profile 122 is reduced).

In order to ensure a stable operation of the test device 110 and/or in order to ensure that the test device 110 is able to align the load current (i.e. the feedback voltage 121) to the target load profile 122, the test device 110 may be implemented according to some or all of the following design measures:

The operational amplifier 111 may be configured to provide an output current to the gate of the transistor 113 which is adapted to the gate capacitance of the transistor 113. In particular, the operational amplifier 111 may be configured to charge the gate capacitance of the transistor 113 within a time interval which is at or below a reaction time threshold. As such, it can be ensured that the control signals 123 provided by the operational amplifier 111 lead to a modification of the drain-source resistance of the transistor 113 within a time interval which is at or below the reaction time threshold. The reaction time threshold may be in the range of 100 ns. By way of example, the operational amplifier 111 may be selected to be able to provide a high output current to the gate of the transistor 113 (e.g. an output current above a pre-determined threshold), wherein the transistor 113 may be selected to have a low gate capacitance (e.g. a gate charge below a pre-determined charge threshold of 4 nC (nano Coulomb) of less).

The gate capacitance of the transistor 113 appears as a nonlinear capacitive load to the operational amplifier 111. The operational amplifier 111 may be selected to be stable when being operated with such capacitive loads.

The operational amplifier 111 may be a high speed operational amplifier. By way of example, a delay between a modification of the target load profile 122 and/or of the feedback voltage 121 and a modification of the control signal 123 may be below a pre-determined time threshold.

The PCB of the test device 110 may be laid out such that a coupling between the control signal 123 at the output of the operational amplifier 111 and the target load profile 122 and/or the feedback voltage 121 at the input of the operational amplifier 111 is reduced (e.g. minimized). This may be achieved by increasing (e.g. maximizing) a distance between the conductive pathways of the input and the output of the operational amplifier 111.

The current sense resistor 112 may have a parasitic inductance which lies below an inductance threshold (e.g. an inductance threshold of a few nH (nano Henry), e.g. 4 nH or less). In particular, the current sense resistor 112 may be selected such that oscillations of the test device 110 are avoided. Such oscillations may be due to the parasitic inductance of the current sense resistor 112 which causes a phase shift of the feedback voltage 121 and which may therefore create an instability on the feedback path.

The on-state resistance of the transistor 113 may be at or below the resistance of the current sense resistor 112. As such, it can be ensured that the maximum load current drawn by the test device 110 is effectively set by the current sense resistor 112, and not limited by the on-state (drain-source) resistance of the transistor 113. As indicated above, the test device 110 is typically used in the context of relatively low output voltages (in the range of 1V) of the voltage regulator 101. In order to allow for relatively high load currents (e.g. of 50 A), the on-state (drain-to-source) resistance of the transistor 113 should be sufficiently low.

The transistor 113 may have relatively fast reaction times, in order to allow for a fast reaction of the load current to a transient of the target load profile 122. By way of example, the transistor 113 may have rise and/or fall times which are at or below a pre-determined time threshold (e.g. a time threshold of 10 ns).

The PCB layout of the test device 110 may be realized in a way to reduce (e.g. minimize) the inductance from the transistor 113 and current sense resistor 112 to the device 101 under test. In particular, the inductance from the drain of the transistor 113 to the ground connection may be reduced (e.g. minimized). An excessive inductance in this path could limit slew rates achievable by the test device 110. Furthermore, an excessive inductance could lead to ringing and instability of the test device 110. A reduction of the inductance of the path from the drain of the transistor 113 to the ground connection may be achieved by positioning the transistor 113 directly adjacent to the connector 116 for connecting the test device 110 to the output of the voltage regulator 101. In other words, the distance between the transistor 113 (in particular the drain of the transistor 113) and the connector 116 may be below a first distance threshold. Furthermore, the current sense resistor 112 may be positioned in direct proximity to the source of the transistor 113. In other words, the distance between the current sense resistor 112 and the source of the transistor 113 may be below a second distance threshold. A short distance between the current sense resistor 112 and the source of the transistor 113 may e.g. be achieved by placing the current sense resistor 112 and the transistor 113 on opposite sides of the PCB of the test device 110.

For added flexibility, the test device 110 may be implemented to be plugged into a female connector vertically to the device 101 under test.

Figure 2:
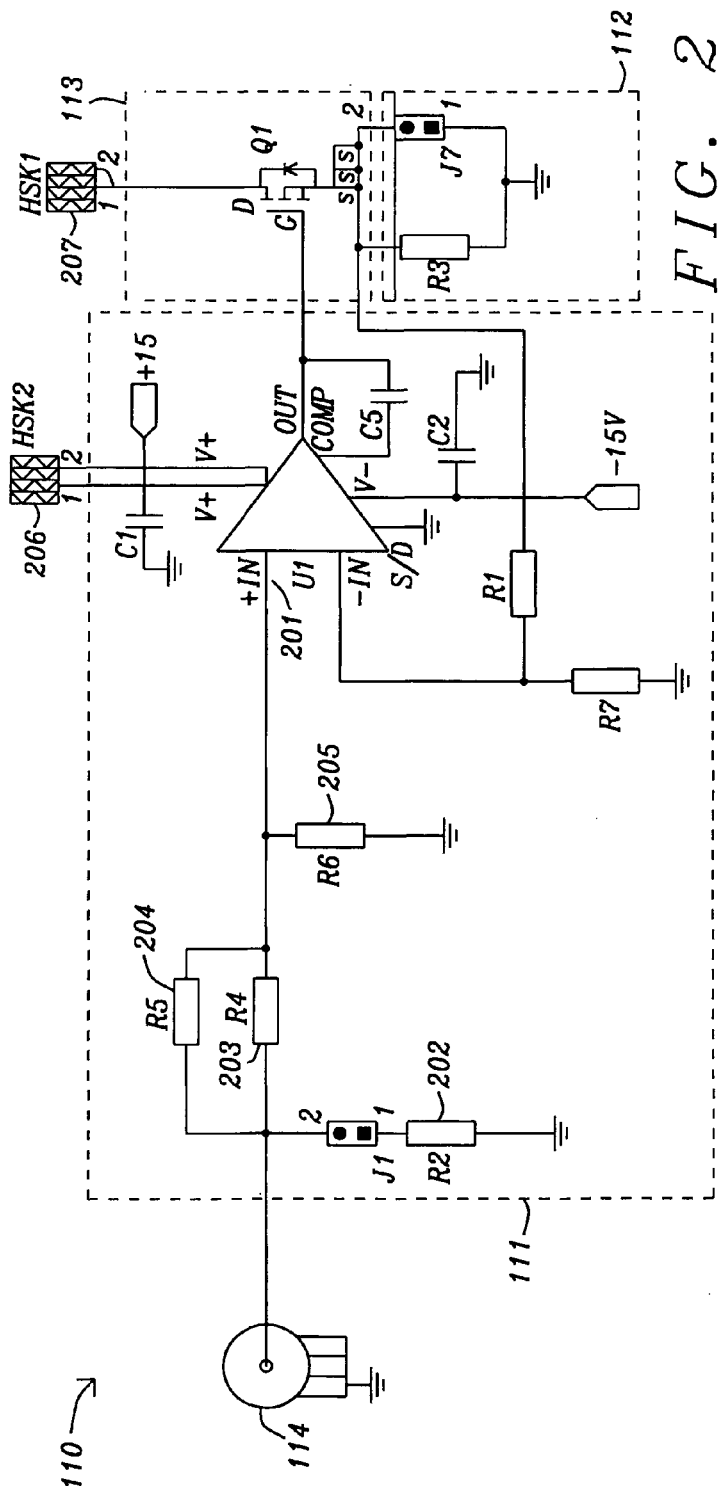
FIG. 2 shows a circuit diagram of an example transient test device.

FIG. 2 shows a circuit diagram of an example test device 110. The circuit diagram shows further details regarding possible implementations of the operational amplifier 111, of the transistor 113 and of the current sense resistor 112. The connector 114 for receiving the target load profile 114 may be implemented as a plug-in connector. The circuitry of the operational amplifier 111 may comprise the operational amplifier 201 itself. Furthermore, an input resistor 202 may be used to provide an optional input termination (e.g. at 50 Ohm). An input voltage divider (comprising the resistors 203, 204, 205) may be used to adjust the target load profile 122 to the current sense resistor 112. In particular, the voltage divider may be used to adjust the scaling of the target load profile 122 to the scaling of the load current drawn by the test device 110. The test device 110 of FIG. 2 further comprises heat sinks 206, 207 which may be used to provide cooling to the test device 110 (e.g. depending on the load current profiles which are to be tested).

The current sense resistor 112 may be interchangeable, in order to allow for the setting of different ranges of load currents. A relatively small current sense resistor 112 (e.g. in the range of 10 mOhm) could be used to test a wide current range from low load currents (using a high drain-to-source resistance of the transistor 113) to high currents (using a low drain-to-source resistance of the transistor 113). However, it has been observed that this leads to relatively high noise when generating low load currents. It is therefore preferable to adapt the resistance of the current sense resistor 112 to the load current range which is to be tested. By way of example, a 10 mOhm resistor 112 may be used to test the load current range of 5 to 25 A, a 100 mOhm resistor 112 may be used to test the load current range of 0.5 to 5 A and a 500 mOhm resistor 112 may be used to test the load current range of 0.05 to 0.5 A.

Figure 3:
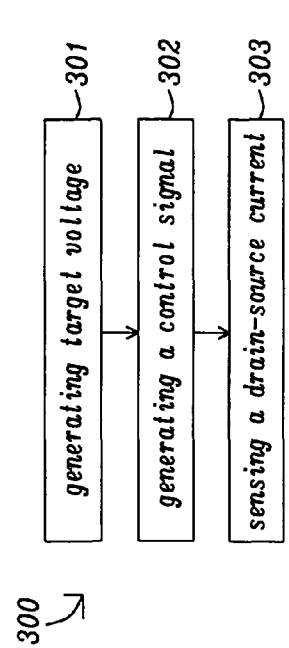
FIG. 3 illustrates a flow chart of an example method for testing a voltage regulator.

FIG. 3 illustrates a flow chart of an example method 300 for testing a voltage regulator subject to a load current. The method 300 comprises generating a target voltage corresponding to a target load current (step 301). The target voltage may be generated by a function generator. The method 300 proceeds in generating a control signal for a transistor, based at least on the target voltage (step 302). Typically, the control signal comprises a gate voltage which is applied to the gate of the transistor and which controls a drain-source resistance of the transistor. The method further comprises sensing a drain-source current through the transistor, thereby yielding a corresponding feedback voltage (step 303). As indicated above, the current sensing may be performed using the current sense resistor 112. The drain-source current typically corresponds to the load current drawn at the output of the voltage regulator. The control signal is generated also based on the feedback voltage. Typically, the control signal is generated such that a deviation of the feedback voltage from the target voltage is reduced.

In the present document, a test device has been described which can be used to test a voltage regulator subject to load transients. The test device is configured to provide a load current with a controllable amplitude and with controllable rise and/or fall edges.

It should be noted that the description and drawings merely illustrate the principles of the proposed methods and systems. Those skilled in the art will be able, to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. A test device configured to generate a load current to be drawn at an output of a voltage regulator, the test device comprising
   a load connector for coupling the test device to the output of the voltage regulator;
   a transistor configured to modulate the current through the load connector subject to a control signal; wherein the current through the load connector corresponds to the load current;
   a current sense resistor arranged in series with the transistor and configured to provide a feedback voltage which is substantially proportional to the load current; and
   an operational amplifier configured to generate the control signal based on the feedback voltage and based on a target voltage; wherein the operational amplifier is configured to generate the control signal, such that an absolute difference between the feedback voltage and the target voltage is reduced.

2. The test device of claim 1, further comprising a target load connector configured to couple the test device to an external function generator providing the target voltage.

3. The test device of claim 2, further comprising a voltage divider arranged between the target load connector and an input of the operational amplifier and configured to scale the target voltage provided at the target load connector.

4. The test device of claim 2, further comprising an input termination resistor arranged between the target load connector and an input of the operational amplifier and configured to adapt an impedance of the test device at the target load connector.

5. The test device of claim 1, wherein the transistor is one or more of:
   a metal oxide semiconductor field effect transistor; and
   an n-type transistor.

6. The test device of claim 1, wherein
   the control signal comprises a gate voltage which is applied to a gate of the transistor;
   the transistor exhibits a gate capacitance;
   the operational amplifier is configured to provide a current corresponding to the gate capacitance within a time interval which is at or below a charging time threshold.

7. The test device of claim 6, wherein the transistor exhibits a rise and/or fall time which is at or below a rise and/or fall time threshold, respectively.

8. The test device of claim 6, wherein a charge of the gate capacitance is at or below 4 nC.

9. The test device of claim 7, wherein the sum of the charging time threshold and the rise and/or fall time threshold is at or below 100 ns.

10. The test device of claim 1, wherein a parasitic inductance of the current sense resistor is at or below an inductance threshold of 10 nH or less.

11. The test device of claim 1, wherein the load connector, the current sense resistor, the transistor and the operational amplifier are arranged on a printed circuit board.

12. The test device of claim 11, wherein the load connector is implemented as a board edge connector which is pluggable into a corresponding female connector of the voltage regulator.

13. The test device of claim 11, wherein the load connector, the transistor and the current sense resistor are arranged such that a conductive path from the load connector, via the transistor and the current sense resistor to ground is at or below a pre-determined path length threshold.

14. The test device of claim 13, wherein the current sense resistor and the transistor are arranged on opposite sides of the printed circuit board.

15. The test device of claim 13, wherein
the transistor is arranged in direct vicinity of the load connector; and
a drain of the transistor is directly coupled to the load connector.

16. The test device of claim 13, further comprising a heat sink.

17. A system comprising
a voltage regulator; and
a test device according to claim 1 and configured to generate a test load for the voltage regulator.

* * * * *